United States Patent
Mezzapelle

(10) Patent No.: US 7,276,450 B2
(45) Date of Patent: Oct. 2, 2007

(54) ETCHING PROCESSES USING $C_4F_8$ FOR SILICON DIOXIDE AND $CF_4$ FOR TITANIUM NITRIDE

(75) Inventor: Joseph J. Mezzapelle, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 11/163,836

(22) Filed: Nov. 1, 2005

(65) Prior Publication Data

US 2007/0095787 A1    May 3, 2007

(51) Int. Cl.
*H01L 21/302* (2006.01)

(52) U.S. Cl. .............. 438/712; 438/724; 438/734; 438/742; 438/743; 438/744

(58) Field of Classification Search ............ 438/712, 438/724, 754, 756, 757, 734, 742, 743, 744
See application file for complete search history.

(56) References Cited

U.S. PATENT DOCUMENTS

| | | | |
|---|---|---|---|
| 5,419,805 A | 5/1995 | Jolly | |
| 5,930,664 A * | 7/1999 | Hsu et al. | 438/612 |
| 6,096,579 A * | 8/2000 | Liao et al. | 438/131 |
| 6,214,742 B1 * | 4/2001 | Shields et al. | 438/720 |
| 6,297,167 B1 | 10/2001 | Wang et al. | |
| 6,350,700 B1 * | 2/2002 | Schinella et al. | 438/723 |
| 6,383,945 B1 | 5/2002 | Huang et al. | |
| 6,479,411 B1 * | 11/2002 | Hui et al. | 438/712 |
| 6,531,404 B1 * | 3/2003 | Nallan et al. | 438/714 |
| 6,566,260 B2 * | 5/2003 | Chooi et al. | 438/687 |
| 6,713,402 B2 | 3/2004 | Smith et al. | |
| 6,746,961 B2 * | 6/2004 | Ni et al. | 438/700 |
| 6,890,863 B1 | 5/2005 | Donohoe et al. | |
| 2003/0162407 A1 | 8/2003 | Maex et al. | |
| 2004/0198065 A1 | 10/2004 | Lee et al. | |
| 2006/0009025 A1 * | 1/2006 | Kanamura | 438/618 |

* cited by examiner

*Primary Examiner*—Binh X. Tran
(74) *Attorney, Agent, or Firm*—Joseph Petrokaitis; Hoffman, Warnick & D'Alessandro LLC

(57) ABSTRACT

Methods of etching a dielectric layer and a cap layer over a conductor to expose the conductor are disclosed. In one embodiment, the methods include the use of a silicon dioxide ($SiO_2$) etching chemistry including octafluorocyclobutane ($C_4F_8$) and a titanium nitride (TiN) etching chemistry including tetrafluoro methane ($CF_4$). The methods prevent etch rate degradation and exhibit reduced electrostatic discharge (ESD) defects.

18 Claims, 3 Drawing Sheets

US 7,276,450 B2

ETCHING PROCESSES USING $C_4F_8$ FOR SILICON DIOXIDE AND $CF_4$ FOR TITANIUM NITRIDE

BACKGROUND OF THE INVENTION

1. Technical Field

The present invention relates generally to semiconductor fabrication, and more particularly, to etching processes using octafluorocyclobutane ($C_4F_8$) for silicon dioxide ($SiO_2$) and tetrafluoro methane ($CF_4$) for titanium nitride (TiN).

2. Related Art

In the semiconductor industry, reactive ion etching (RIE) is used to open pathways for circuitry within a semiconductor chip. One structure formed using RIE, for example, is a via, which electrically connects conductors within different layers. RIE is a variation of plasma (gas) etching in which a semiconductor wafer is placed on a radio frequency (RF) powered electrode, and etching species are extracted and accelerated from the plasma toward the surface to be etched. A chemical etching reaction occurs that removes parts of the surface. RIE is one of the most common etching techniques in semiconductor manufacturing.

Referring to FIG. 1, a conventional semiconductor structure 10 including layers 12, 14 prior to etching is shown. Structure 10 includes a conductor layer 14 including a dielectric layer 16 (e.g., of silicon dioxide ($SiO_2$)) surrounding a conductor 18 (e.g., of copper (Cu) or aluminum (Al)); a cap layer 20 (e.g., of titanium nitride (TiN)) atop conductor level 14; a dielectric layer 22 (e.g., of silicon dioxide ($SiO_2$)) atop cap layer 20; another dielectric layer 24 (e.g., of silicon nitride $Si_3N_4$) atop dielectric layer 22; and a patterned photoresist 26.

A typical RIE process is conducted in a single plasma chamber capable of two RF settings, e.g., approximately 2 MHz (bottom RF source electrode) and approximately 27 MHz (top bias power electrode). One conventional RIE process for a stack having the following thicknesses: 6 μm of photoresist 26 (e.g., Gpoly), 4000 Å of dielectric layer 24 of silicon nitride, 4500 Å of dielectric layer 22 of silicon dioxide and 250-350 Å of cap layer 20 of titanium nitride will now be described. The conventional RIE process may include the following steps: performing a descum, etching dielectric layer 24, etching dielectric layer 22 using argon (Ar), tetrafluoro methane ($CF_4$) and carbon monoxide (CO), and a two step etching of cap layer 20. A first cap layer etching step may use argon (Ar), octafluorocyclobutane ($C_4F_8$), oxygen ($O_2$), and trifluoro methane ($CHF_3$), and a second cap layer etching step may use argon (Ar) and nitrogen trifluoride ($NF_3$). Finally, an oxygen ($O_2$) plasma chemistry (ash) is performed to remove residual RIE polymers from conductor 18.

The conventional RIE process for removing TiN in a dielectric etch tool suffers from a number of problems. First, it leads to tool degradation, and more specifically, to a lowered etch rate and a decreased etch uniformity of subsequent RIE processing, which reduces yield. Second, typical plasma processes lead to wafer degradation. For example, the above-described process has exhibited increased electro-static discharge (ESD) defects within kerfs of wafers. One approach to address this situation has been to employ metal etch systems, rather than dielectric etching systems. However, these systems cause defects in the profile of the remaining conductor 18, e.g., of aluminum (Al), under cap layer 20 (titanium nitride). That is, they are not selective to aluminum (Al).

In view of the foregoing, there is a need in the art for an improved RIE process that does not suffer from the problems of the related art.

SUMMARY OF THE INVENTION

The invention includes methods of etching a dielectric layer and a cap layer over a conductor to expose the conductor. In one embodiment, the methods include the use of a silicon dioxide ($SiO_2$) etching chemistry including octafluorocyclobutane ($C_4F_8$) and a titanium nitride (TiN) etching chemistry including tetrafluoro methane ($CF_4$). The process prevents etch rate degradation and exhibits reduced ESD defects.

A first aspect of the invention is directed to a method of etching to expose a conductor, the method comprising the steps of: etching through a first dielectric layer including silicon dioxide ($SiO_2$) using a chemistry including octafluorocyclobutane ($C_4F_8$); and etching through a cap layer including titanium nitride (TiN) using a chemistry including tetrafluoro methane ($CF_4$) to expose the conductor.

A second aspect of the invention includes a method of etching to expose a conductor, the method comprising the steps of: etching through a first dielectric layer including silicon nitride ($Si_3N_4$); etching through a second dielectric layer including silicon dioxide ($SiO_2$) using a chemistry including a gas flow of approximately 13-17 standard cubic centimeters (sccm) of octafluorocyclobutane ($C_4F_8$); and etching through a cap layer including titanium nitride (TiN) using a chemistry including a gas flow of approximately 135-165 sccm of tetrafluoro methane ($CF_4$) to expose the conductor.

A third aspect of the invention relates to a method of exposing a conductor below a stack including a patterned photoresist over a silicon nitride ($Si_3N_4$) layer over a silicon dioxide ($SiO_2$) layer over a titanium nitride (TiN) cap layer, the method comprising the steps of: etching through the silicon nitride ($Si_3N_4$); etching through the silicon dioxide ($SiO_2$) using the following conditions: approximately 90-110 mTorr (mT) of pressure, an RF energy of approximately 950-1050 watts (W) at approximately 27 MHz and at approximately 2 MHz, and a gas flow of approximately 375-425 sccm of argon (Ar), approximately 13-17 sccm of octafluorocyclobutane ($C_4F_8$) and approximately 5-7 sccm of oxygen ($O_2$); and etching through the titanium nitride layer include titanium nitride (TiN) using the following conditions: approximately 255-285 mT of pressure, an RF energy of approximately 1350-1450 W at approximately 27 MHz and approximately 650-750 W at approximately 2 MHz, and a gas flow of approximately 135-165 sccm of tetrafluoro methane ($CF_4$) and approximately 90-110 sccm of nitrogen ($N_2$).

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

With reference to the accompanying drawings, FIG. 2-6 show one embodiment of a method of etching to form an opening to expose a conductor according to the invention. A pattern for the opening is provided by a photoresist. The method modifies the conventional process such that electro-static discharge (ESD) defects are reduced and etch rates are not degraded. The process is carried out in a typical dielectric reactive ion etching (RIE) tool, i.e., not a metal RIE tool. The RIE chamber used is capable of two RF settings, e.g., approximately 2 MHz (bottom RF source electrode) and approximately 27 MHz (top bias power electrode).

Figure 1:
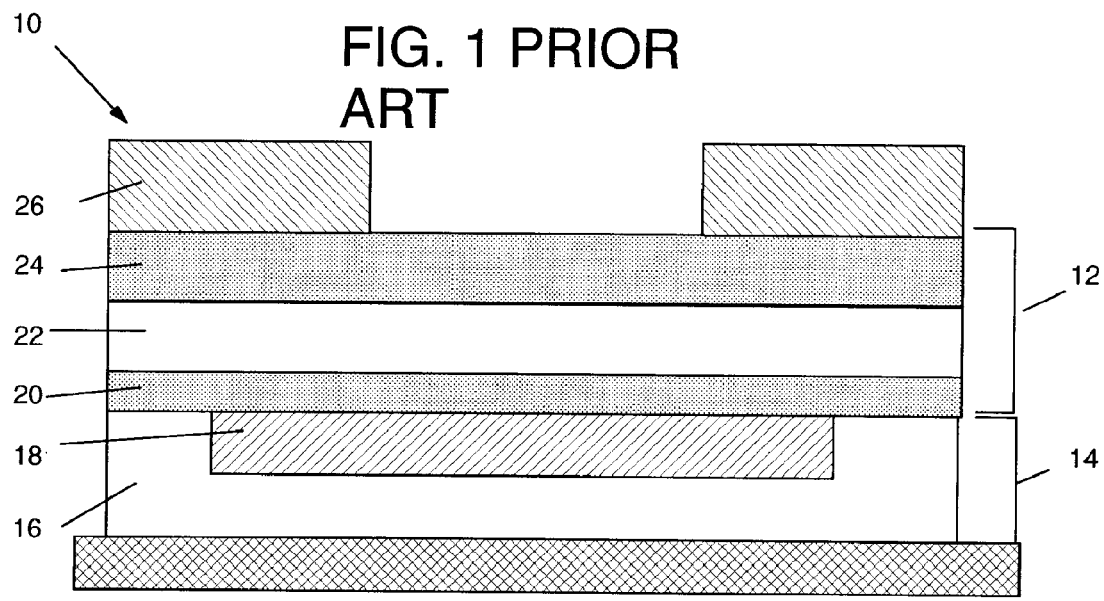
FIG. 1 shows a conventional semiconductor structure including dielectric layers prior to etching.

The process begins with a conventional semiconductor structure 100 including a stack (sometimes referred to as a large-via pad stack) including dielectric layers 112, similar to that shown in FIG. 1. Structure 100 includes a conductor level 114 including a dielectric layer 116 (e.g., of silicon dioxide ($SiO_2$) or any other appropriate dielectric material) surrounding a conductor 118 (e.g., of copper (Cu) or aluminum (Al)). A stack over conductor 118 includes a cap layer 120 including titanium nitride (TiN) atop conductor level 114; a dielectric layer 122 including silicon dioxide ($SiO_2$) over cap layer 120; another dielectric layer 124 including silicon nitride ($Si_3N_4$) over dielectric layer 122; and a patterned photoresist 126. Patterned photoresist 126 includes a pattern for the opening to be formed to expose conductor 118. Dielectric layer 122 may include any silicon dioxide ($SiO_2$) type material such as hydrogenated silicon oxycarbide (SiCOH), CORAL™ available from Novellus, tetraethyl orthosilicate ($Si(OC_2H_5)_4$)(TEOS), fluorine doped TEOS (FTEOS), fluorine doped silicate glass (FSG), undoped silicate glass (USG), boro-phospho-silicate glass (BPSG), etc. Cap layer 120 may include any typical titanium nitride-based cap material.

The invention is described relative to a stack having the following thicknesses: 6 μm of photoresist 126 (e.g., Gpoly), 4000 Å of dielectric layer 124 of silicon nitride, 4500 Å of dielectric layer 122 including silicon dioxide and 250-350 Å of cap layer 120 including titanium nitride (TiN). It should be recognized that where the stack thicknesses vary, at least the time of etching may vary appropriately.

Figure 2:
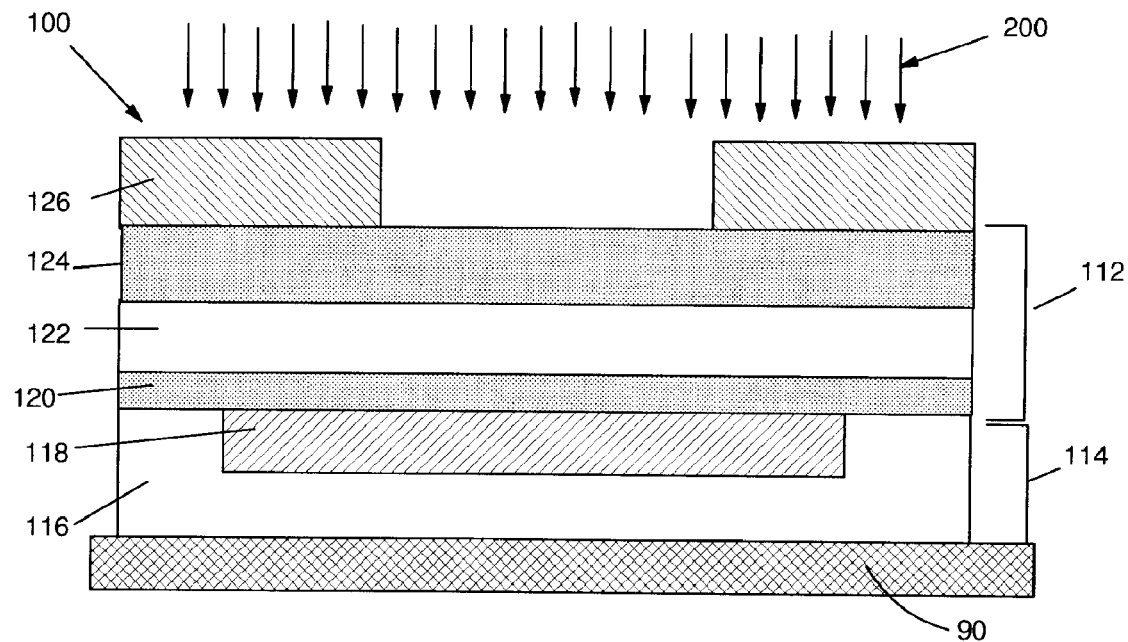
FIGS. 2-6 show one embodiment of a method of etching according to the invention.

An initial step of the method includes, as shown in FIG. 2, performing a descum 200. The descum performing step removes remaining residuals from the lithography step prior to etching, which allows for a more uniform etch of the silicon nitride surface. In one embodiment, the descum is performed using a gas flow of nitrogen ($N_2$) and hydrogen ($H_2$). In this description and the claims, the term "approximately X-Y" will be used. It is understood that the approximation applies to the lower value and the higher value of the range. The descum performing step may continue for approximately 8-12 seconds. The descum performing step may also include using the following additional conditions: a wafer-holding chuck 90 (FIGS. 2-6) pressure of approximately 18-22 Torr of helium (He), and a chuck temperature may be approximately 18-22° C.

Figure 3:
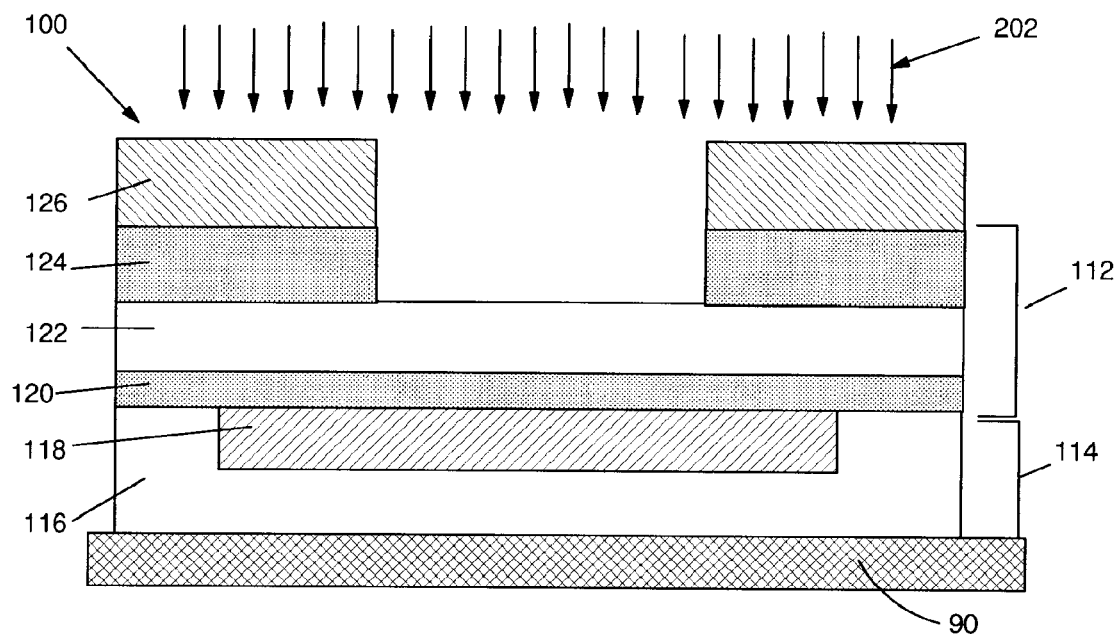

As shown in FIG. 3, etching 202 through dielectric layer 124, e.g., silicon nitride, is next. The etch conditions 202 used may be any conventional method. For example, etch conditions 202 may include using a gas flow of argon (Ar), tetrafluoro methane ($CF_4$), trifluoro methane ($CHF_3$) and oxygen ($O_2$). Trifluoro methane ($CHF_3$) (also known as fluoroform) is available, for example, under trade name Freon® 23 from Dupont. Etching 202 may continue for approximately 40-50 seconds. A chuck 90 pressure may be, for example, approximately 18-20 Torr of helium (He), and a chuck 90 temperature may be approximately 18-20° C.

Figure 4:
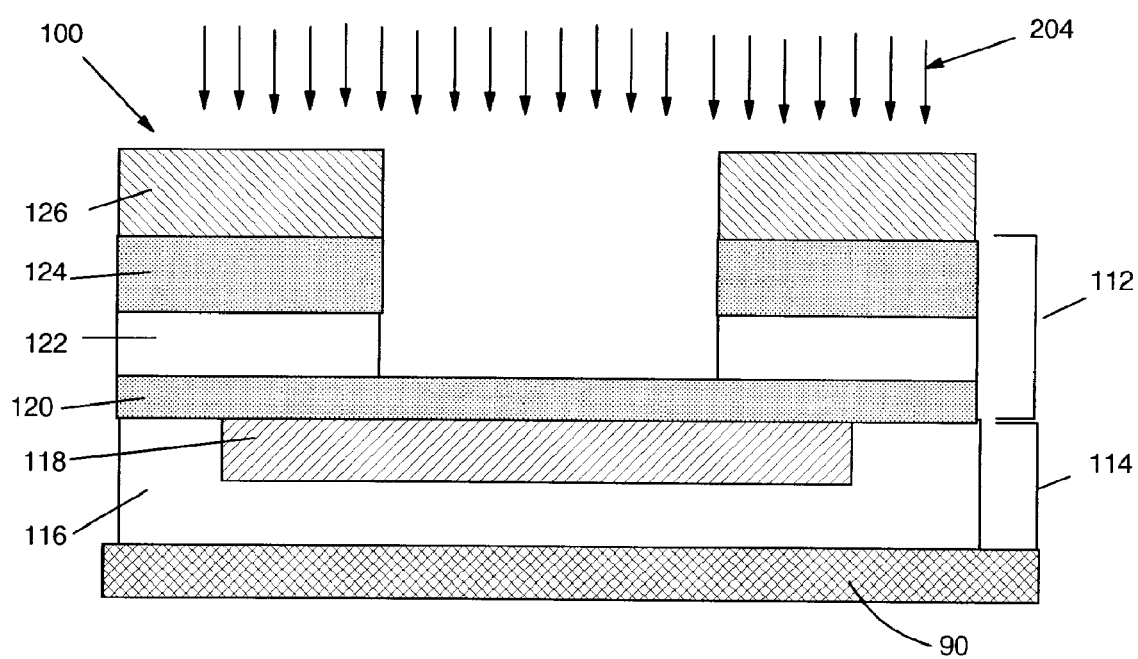

Next, as shown in FIG. 4, dielectric layer 122 including silicon dioxide ($SiO_2$) is etched. In one embodiment, etching chemistry 204 includes using the following conditions: approximately 90-110 mTorr (mT) of pressure, an RF energy of approximately 950-1050 watts (W) at approximately 27 MHz and at approximately 2 MHz, and a gas flow of approximately 375-425 sccm of argon (Ar), approximately 13-17 sccm of octafluorocyclobutane ($C_4F_8$) and approximately 5-7 sccm of oxygen ($O_2$). Etching 204 may last for approximately 80-95 seconds. Etching 204 may also using the following conditions: a wafer-holding chuck 90 pressure of approximately 18-22 Torr of helium (He), and a chuck temperature may be approximately 18-22° C.

Figure 5:
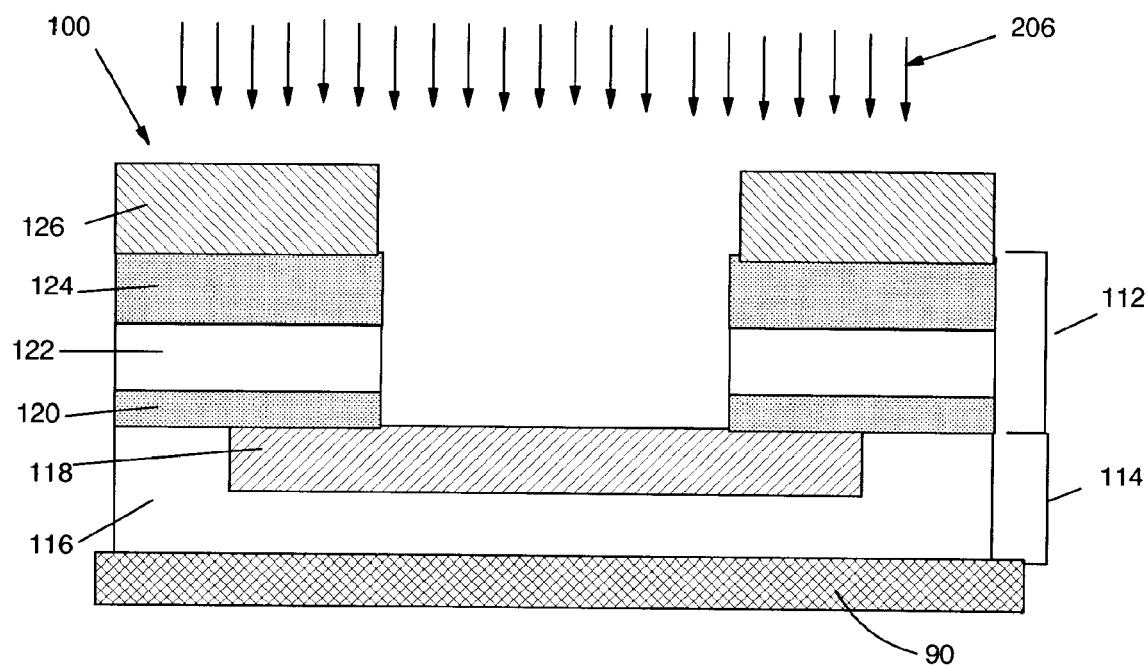

Referring to FIG. 5, a next step includes etching cap layer 120 including titanium nitride (TiN). Etching 206 may use the following conditions: approximately 255-285 mT of pressure, an RF energy of approximately 1350-1450 W at approximately 27 MHz and approximately 650-750 W at approximately 2 MHz, and a gas flow of approximately 135-165 sccm of tetrafluoro methane ($CF_4$) and approximately 90-110 sccm of nitrogen ($N_2$). Etching 206 may last for approximately 85-100 seconds. Etching 206 may also using the following conditions: a wafer-holding chuck 90 pressure of approximately 18-22 Torr of helium (He), and a chuck temperature may be approximately 18-22° C.

Figure 6:
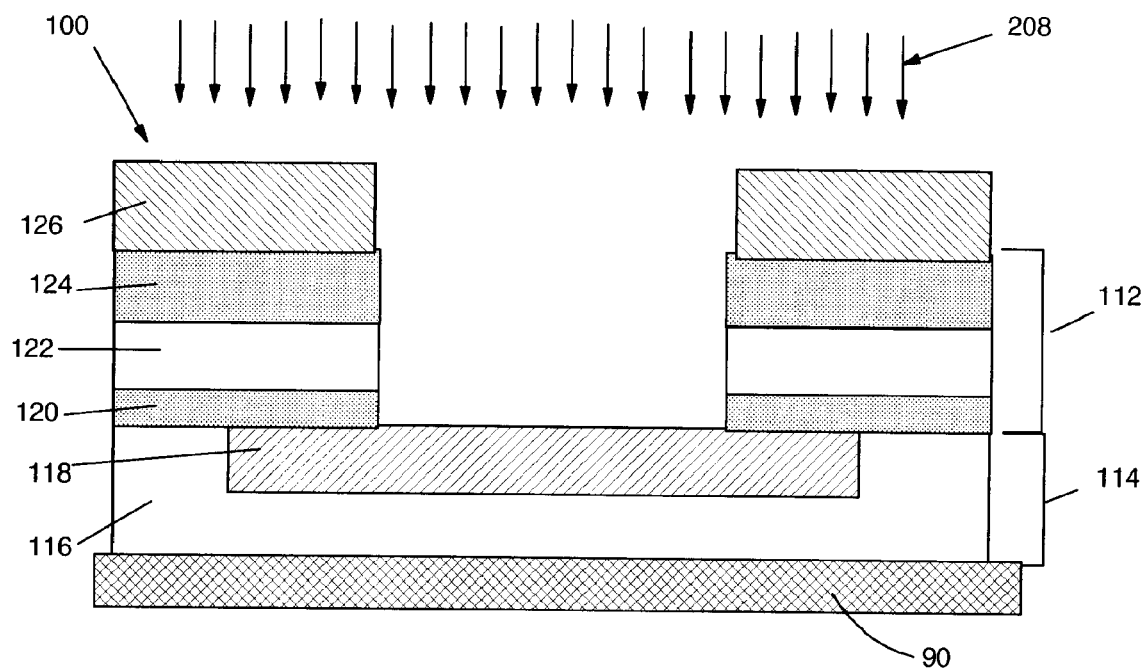

FIG. 6 shows a next step including performing an ash step 208 to remove residual RIE polymers from conductor 118. Ash performing step 208 may include any now known or later developed oxygen-based ashing chemistry.

The above-described invention provides a two-step process for etching silicon dioxide (SiO2) and titanium nitride (TiN). The process is selective to aluminum (Al) and exhausts less of photoresist 126 compared to conventional RIE processes. The method modifies the conventional process such that electro-static discharge (ESD) defects are reduced and etch rates are not degraded. In addition, the process is carried out in a typical dielectric reactive ion etching tool, i.e., not a metal RIE tool.

While this invention has been described in conjunction with the specific embodiment(s) outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of etching to expose a conductor, the method comprising:

etching through a first dielectric layer including silicon dioxide ($SiO_2$) using a chemistry including octafluorocyclobutane ($C_4F_8$); and etching through a cap layer including titanium nitride (TiN) using a chemistry including tetrafluoro methane ($CF_4$) to expose the conductor, wherein the first dielectric layer etching includes using the following conditions:

approximately 90-110 mTorr (mT) of pressure, an RF energy of approximately 950-1050 watts (W) at approximately 27 MHz at one electrode and at approximately 2 MHz at another electrode, and a gas flow of approximately 375-425 standard cubic centimeters (sccm) of argon (Ar), approximately 13-17 sccm of octafluorocyclobutane ($C_4F_8$) and approximately 5-7 sccm of oxygen ($O_2$).

2. The method of claim 1, wherein the cap layer etching includes using the following conditions: approximately 255-285 mT of pressure, an RF energy of approximately 1350-1450 W at approximately 27 MHz at one electrode and approximately 650-750 W at approximately 2 MHz at another electrode, and a gas flow of approximately 135-165 sccm of tetrafluoro methane ($CF_4$) and approximately 90-110 sccm of nitrogen ($N_2$).

3. The method of claim 1, wherein each etching is conducted in a reactive ion etching tool.

4. The method of claim 1, wherein each etching includes using the following conditions: a wafer-holding chuck pressure of approximately 18-22 Torr of helium (He), and a chuck temperature of approximately 18-22° C.

5. The method of claim 1, further comprising etching through a second dielectric layer including silicon nitride ($Si_3N_4$) prior to etching the first dielectric layer, the second dielectric positioned over the first dielectric layer.

6. The method of claim 1, further comprising performing an ash after the cap layer etching.

7. The method of claim 1, further comprising performing a descum prior to the etching of the first dielectric layer.

8. The method of claim 7, wherein the performing a descum includes using a gas flow including nitrogen ($N_2$) and hydrogen ($H_2$).

9. A method of etching to expose a conductor, the method comprising:
    etching through a first dielectric layer including silicon nitride ($Si_3N_4$); etching through a second dielectric layer including silicon dioxide ($SiO_2$) using a chemistry including a gas flow of approximately 13-17 standard cubic centimeters (sccm) of octafluorocyclobutane ($C_4F_8$); and
    etching through a cap layer including titanium nitride (TiN) using a chemistry including a gas flow of approximately 135-165 sccm of tetrafluoro methane ($CF_4$) to expose the conductor,
    wherein the second dielectric layer etching includes using the following conditions: approximately 90-110 mTorr (mT) of pressure, an RF energy of approximately 950-1050 watts (W) at approximately 27 MHz at one electrode and at approximately 2 MHz at another electrode, and the gas flow further includes approximately 375-425 sccm of argon (Ar) and approximately 5-7 sccm of oxygen ($O_2$).

10. The method of claim 9, wherein the cap layer etching includes using the following conditions: approximately 255-285 mT of pressure, an RF energy of approximately 1350-1450 W at approximately 27 MHz at one electrode and approximately 650-750 W at approximately 2 MHz at another electrode, and the gas flow further includes approximately 90-110 sccm of nitrogen ($N_2$).

11. The method of claim 9, wherein each etching is conducted in a reactive ion etching tool.

12. The method of claim 9, wherein each etching includes using the following conditions: a wafer-holding chuck pressure of approximately 18-22 Torr of helium (He), and a chuck temperature of approximately 18-22° C.

13. The method of claim 9, further comprising performing an ash after the cap layer etching.

14. The method of claim 9, further comprising performing a descum prior to the etching of the first dielectric layer, the performing of a descum including using a gas flow of nitrogen ($N_2$) and hydrogen ($H_2$).

15. The method of claim 14, wherein the performing of a descum includes using the following additional conditions: a wafer-holding chuck pressure of approximately 18-22 Torr of helium (He), and a chuck temperature of approximately 18-22° C.

16. A method of exposing a conductor below a stack including a patterned photoresist over a silicon nitride ($Si_3N_4$) layer over a silicon dioxide ($SiO_2$) layer over a titanium nitride (TiN) cap layer, the method comprising:
    etching through the silicon nitride ($Si_3N_4$) layer;
    etching through the silicon dioxide ($SiO_2$) layer using the following conditions: approximately 90-110 mTorr (mT) of pressure, an RF energy of approximately 950-1050 watts (W) at approximately 27 MHz at one electrode and at approximately 2 MHz at another electrode, and a gas flow of approximately 375-425 sccm of argon (Ar), approximately 13-17 sccm of octafluorocyclobutane ($C_4F_8$) and approximately 5-7 sccm of oxygen ($O_2$); and
    etching through the titanium nitride (TiN) layer using the following conditions: approximately 255-285 mT of pressure, an RF energy of approximately 1350-1450 W at approximately 27 MHz at one electrode and approximately 650-750 W at approximately 2 MHz at another electrode, and a gas flow of approximately 135-165 sccm of tetrafluoro methane ($CF_4$) and approximately 90-110 sccm of nitrogen ($N_2$).

17. The method of claim 16, wherein the etchings are preceded by a performing a descum and followed by performing an ash.

18. The method of claim 16, wherein each etching includes using the following conditions: a wafer-holding chuck pressure of approximately 18-22 Torr of helium (He), and a chuck temperature of approximately 18-22° C.

* * * * *